United States Patent
Furusawa

(10) Patent No.: US 10,453,990 B2
(45) Date of Patent: Oct. 22, 2019

(54) SEMICONDUCTOR LIGHT EMITTING ELEMENT AND METHOD FOR MANUFACTURING SEMICONDUCTOR LIGHT EMITTING ELEMENT

(71) Applicant: NIKKISO CO., LTD., Tokyo (JP)

(72) Inventor: Yuta Furusawa, Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 15/933,868

(22) Filed: Mar. 23, 2018

(65) Prior Publication Data

US 2018/0277714 A1  Sep. 27, 2018

(30) Foreign Application Priority Data

Mar. 24, 2017 (JP) .................. 2017-059404

(51) Int. Cl.
| H01L 31/00 | (2006.01) |
|---|---|
| H01L 33/02 | (2010.01) |
| H01L 33/06 | (2010.01) |
| H01L 33/00 | (2010.01) |
| H01L 33/32 | (2010.01) |
| H01L 33/14 | (2010.01) |

(52) U.S. Cl.
CPC .......... H01L 33/025 (2013.01); H01L 33/007 (2013.01); H01L 33/06 (2013.01); H01L 33/145 (2013.01); H01L 33/32 (2013.01); H01L 33/02 (2013.01)

(58) Field of Classification Search
CPC ........... H01L 2924/181; H01L 2224/14; H01L 2224/16225; H01L 2924/00012; H01L 33/56; H01L 33/32; H01L 2224/8192; H01L 33/54; H01L 33/62; H01L 33/007; H01L 33/02; H01L 33/025; H01L 33/06; H01L 33/145; C08F 32/04
See application file for complete search history.

(56) References Cited

U.S. PATENT DOCUMENTS

2003/0080331 A1 * 5/2003 Ono .................. H01L 27/0605
257/14
2009/0289270 A1 * 11/2009 Hanawa .................. C30B 25/02
257/98

FOREIGN PATENT DOCUMENTS

| JP | 2007201195 A | 8/2007 |
| JP | 2010-205767 A | 9/2010 |
| JP | 2010212493 | 9/2010 |
| JP | 2016213448 | 12/2016 |

OTHER PUBLICATIONS

Japanese Patent Office. Office Action. dated Sep. 25, 2018. 3 pages. With English Translation. (6 pages).

* cited by examiner

*Primary Examiner* — Robert G Bachner
(74) *Attorney, Agent, or Firm* — Muncy, Geissler, Olds & Lowe, P.C.

(57) ABSTRACT

A semiconductor light emitting element includes: an n-type clad layer formed of an n-type aluminum gallium nitride (AlGaN) based semiconductor material; an intermediate layer provided on the n-type clad layer and having a higher oxygen (O) concentration than the n-type clad layer; an active layer provided on the intermediate layer and formed of an AlGaN-based semiconductor material; and a p-type semiconductor layer provided on the active layer. The intermediate layer may contain at least oxygen (O) and aluminum (Al).

10 Claims, 2 Drawing Sheets

SEMICONDUCTOR LIGHT EMITTING ELEMENT AND METHOD FOR MANUFACTURING SEMICONDUCTOR LIGHT EMITTING ELEMENT

RELATED APPLICATION

Priority is claimed to Japanese Patent Application No. 2017-059404, filed on Mar. 24, 2017, the entire content of which is incorporated herein by reference.

BACKGROUND OF THE INVENTION

1. Field of the Invention

The present invention relates to a semiconductor light emitting element and a method for manufacturing a semiconductor light emitting element.

2. Description of the Related Art

In recent years, there have been developed semiconductor light emitting elements for outputting deep ultraviolet light. A light emitting element for deep ultraviolet light includes aluminum gallium nitride (AlGaN) based n-type clad layer, active layer, and p-type clad layer, sequentially stacked on a substrate. In order to improve light emission output, it is proposed to form an electron blocking layer made of aluminum nitride (AlN) between the active layer and the p-type semiconductor layer.

For semiconductor light emitting elements for deep ultraviolet light, further improvement in light emission output is required.

SUMMARY OF THE INVENTION

The present invention has been made in view of such a problem, and an illustrative purpose thereof is to provide a technique for improving light emission output of a semiconductor light emitting element.

A semiconductor light emitting element according to one embodiment of the present invention includes: an n-type clad layer formed of an n-type aluminum gallium nitride (AlGaN) based semiconductor material; an intermediate layer provided on the n-type clad layer and having a higher oxygen (O) concentration than the n-type clad layer; an active layer provided on the intermediate layer and formed of an AlGaN-based semiconductor material; and a p-type semiconductor layer provided on the active layer.

According to this embodiment, since the intermediate layer having a high oxygen concentration is provided between the n-type clad layer and the active layer, transmission of non-uniformity or fluctuations in the crystal structure of the n-type clad layer to the active layer is prevented, so that deterioration in crystal quality of the active layer can be prevented. Accordingly, the crystal structure of the active layer can be stabilized, so that the light emission output of the light emitting element can be improved.

The intermediate layer may contain at least oxygen (O) and aluminum (Al).

A peak oxygen concentration in the intermediate layer may be $2 \times 10^{17}/cm^3$ or greater.

A peak oxygen concentration in the intermediate layer may be $1 \times 10^{19}/cm^3$ or less.

The thickness of the intermediate layer may be 10 nm or less.

The active layer may have a multiple quantum well structure in which barrier layers formed of an AlGaN-based semiconductor material and well layers formed of an AlGaN-based semiconductor material are alternately stacked.

Another embodiment of the present invention is a method for manufacturing a semiconductor light emitting element. The method includes: forming an n-type clad layer formed of an n-type aluminum gallium nitride (AlGaN) based semiconductor material on a substrate; forming an intermediate layer having a higher oxygen (O) concentration than the n-type clad layer, on a surface of the n-type clad layer; forming an active layer formed of an AlGaN-based semiconductor material on the intermediate layer; and forming a p-type semiconductor layer on the active layer.

According to this embodiment, since the intermediate layer having a high oxygen concentration is provided between the n-type clad layer and the active layer, transmission of non-uniformity or fluctuations in the crystal structure of the n-type clad layer to the active layer is prevented, so that deterioration in crystal quality of the active layer can be prevented. Accordingly, the crystal structure of the active layer can be stabilized, so that the light emission output of the light emitting element can be improved.

The intermediate layer may be formed by oxidizing a surface of the n-type clad layer.

The intermediate layer may be formed at a temperature in a range equal to or higher than 0 degrees C. and lower than 900 degrees C., in atmospheric gas containing oxygen gas ($O_2$).

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
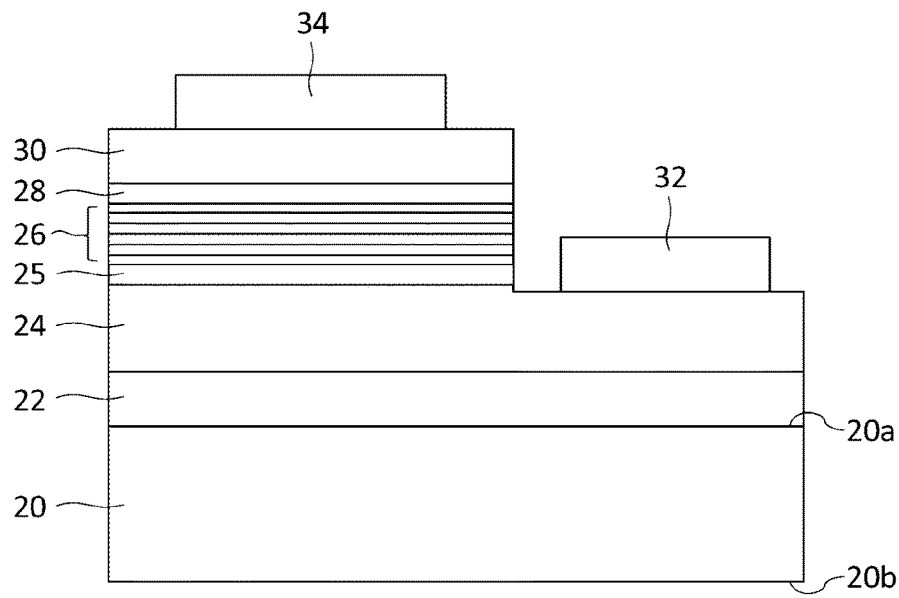
FIG. 1 is a sectional view that schematically shows a configuration of a semiconductor light emitting element according to an embodiment.

The invention will now be described by reference to the preferred embodiments. This does not intend to limit the scope of the present invention, but to exemplify the invention.

Hereinafter, a mode for carrying out the present invention will be described in detail with reference to the drawings. In the description, like reference characters designate like elements, and the same description thereof will be appropriately omitted. Also, in order to assist in understanding of the description, the dimensional ratio of each constituting element in each drawing does not necessarily coincide with that in the actual light emitting element.

FIG. 1 is a sectional view that schematically shows a configuration of a semiconductor light emitting element 10 according to an embodiment. The semiconductor light emitting element 10 is a light emitting diode (LED) chip configured to emit "deep ultraviolet light" of which the center wavelength λ is about 360 nm or less. In order to output deep ultraviolet light with such a wavelength, the semiconductor light emitting element 10 is formed of an aluminum gallium nitride (AlGaN) based semiconductor material of which the band gap is about 3.4 eV or greater. The present embodiment particularly describes the case of emitting deep ultraviolet light of which the center wavelength λ is in the range of about 240 nm to 350 nm.

In the present specification, an "AlGaN-based semiconductor material" means a semiconductor material mainly containing aluminum nitride (AlN) and gallium nitride (GaN), and the semiconductor material may also contain another material, such as indium nitride (InN). Accordingly, the "AlGaN-based semiconductor materials" in the present specification may be represented by the composition of $In_{1-x-y}Al_xGa_yN$ (0≤x+y≤1, 0≤x≤1, 0≤y≤1), for example, which includes AlN, GaN, AlGaN, indium aluminum nitride (InAlN), indium gallium nitride (InGaN), and indium aluminum gallium nitride (InAlGaN).

Also, among the "AlGaN-based semiconductor materials", materials that do not substantially contain AlN may be distinctively referred to as "GaN-based semiconductor materials". The "GaN-based semiconductor materials", mainly containing GaN and InGaN, also include materials that contain a slight amount of AlN besides GaN and InGaN. Similarly, among the "AlGaN-based semiconductor materials", materials that do not substantially contain GaN may be distinctively referred to as "AlN-based semiconductor materials". The "AlN-based semiconductor materials", mainly containing AlN and InAlN, also include materials that contain a slight amount of GaN besides AlN and InAlN.

The semiconductor light emitting element 10 comprises a substrate 20, a buffer layer 22, an n-type clad layer 24, an intermediate layer 25, an active layer 26, an electron blocking layer 28, a p-type clad layer 30, an n-side electrode 32, and a p-side electrode 34.

The substrate 20 is a substrate that transmits deep ultraviolet light emitted by the semiconductor light emitting element 10 and may be a sapphire ($Al_2O_3$) substrate, for example. The substrate 20 includes a first main surface 20a, and a second main surface 20b located opposite to the first main surface 20a. The first main surface 20a is a main surface as a crystal growth surface on which the buffer layer 22 and other layers thereabove are grown. The second main surface 20b is a main surface as a light extraction surface through which deep ultraviolet light emitted by the active layer 26 is extracted to the external. In a modification, the substrate 20 may be an aluminum nitride (AlN) substrate, or may be an aluminum gallium nitride (AlGaN) substrate.

The buffer layer 22 is formed on the first main surface 20a of the substrate 20. The buffer layer 22 is a base layer (template layer) on which the n-type clad layer 24 and other layers thereabove are formed. The buffer layer 22 may be an undoped AlN layer, for example, which is specifically an AlN layer grown at a high temperature {high temperature AlN (HT-AlN)}. The buffer layer 22 may include an undoped AlGaN layer formed on the AlN layer. In a modification, when the substrate 20 is an AlN substrate or an AlGaN substrate, the buffer layer 22 may be constituted only by an undoped AlGaN layer.

The n-type clad layer 24 is formed on the buffer layer 22. The n-type clad layer 24 is an n-type AlGaN-based semiconductor material layer and may be an AlGaN layer doped with silicon (Si) as an n-type impurity, for example. The composition ratio in the n-type clad layer 24 is selected so that the n-type clad layer 24 transmits deep ultraviolet light emitted by the active layer 26, and the n-type clad layer 24 may be configured so that the mole fraction of AlN is 20% or greater, preferably 40% or greater or 50% or greater, for example. The n-type clad layer 24 has a band gap larger than the wavelength of deep ultraviolet light emitted by the active layer 26 and may be configured to have a band gap of 4.3 eV or greater, for example. The n-type clad layer 24 may be preferably configured so that the mole fraction of AlN is 80% or less, i.e., the band gap is 5.5 eV or less, and may be more desirably configured so that the mole fraction of AlN is 70% or less (i.e., the band gap is 5.2 eV or less). The n-type clad layer 24 has a thickness in the range of about 1 μm to 3 μm and may have a thickness of about 2 μm, for example.

The intermediate layer 25 is formed on the n-type clad layer 24. The intermediate layer 25 is a layer having a higher oxygen (O) concentration than the n-type clad layer 24, and may have an oxygen concentration in a range from $2 \times 10^{17}/cm^3$ to $1 \times 10^{19}/cm^3$ inclusive, for example. The intermediate layer 25 contains at least oxygen (O) and aluminum (Al), and may be formed of aluminum oxide ($Al_2O_3$), aluminum oxynitride (AlON), or aluminum gallium oxynitride (AlGaON), for example. The intermediate layer 25 may contain silicon (Si). The intermediate layer 25 is preferably formed thinner so as not to interfere with carrier injection into the active layer 26, and has a thickness of 10 nm or less, such as 5 nm, 3 nm, 2 nm, 1 nm or less. The intermediate layer 25 may have a thickness in the range of about a single layer of atoms to ten layers of atoms.

The active layer 26 is formed of an AlGaN-based semiconductor material and provided between the n-type clad layer 24 and the electron blocking layer 28, forming a double hetero junction structure. The active layer 26 has a single-layer or multi-layer quantum well structure and may be constituted by a stacked body including a barrier layer formed of an undoped AlGaN-based semiconductor material and a well layer formed of an undoped AlGaN-based semiconductor material, for example. The active layer 26 is configured to have a band gap of 3.4 eV or greater so as to output deep ultraviolet light with a wavelength of 355 nm or less, and the composition ratio of AlN in the active layer 26 may be selected so that the active layer 26 emits deep ultraviolet light with a wavelength of 310 nm or less, for example.

The electron blocking layer 28 is formed on the active layer 26. The electron blocking layer 28 is a p-type AlGaN-based semiconductor material layer and may be configured so that the mole fraction of AlN is 40% or greater, preferably 50% or greater, for example. The electron blocking layer 28 may be configured so that the mole fraction of AlN is 80% or greater, or may be formed of an AlN-based semiconductor material that does not substantially contain GaN. The electron blocking layer has a thickness in the range of about 1 nm to 10 nm and may have a thickness in the range of about 2 nm to 5 nm, for example. The electron blocking layer 28 may be an undoped semiconductor layer, instead of a p-type semiconductor layer.

The p-type clad layer 30 is a p-type semiconductor layer formed on the electron blocking layer 28. The p-type clad layer 30 is a p-type AlGaN-based semiconductor material layer and may be an AlGaN layer doped with magnesium (Mg) as a p-type impurity, for example. The p-type clad layer 30 has a thickness in the range of about 300 nm to 700 nm and may have a thickness in the range of about 400 nm to 600 nm, for example. The p-type clad layer 30 may be formed of a p-type GaN-based semiconductor material that does not substantially contain AlN.

The n-side electrode 32 is formed on a partial region of the n-type clad layer 24. The n-side electrode 32 is constituted by a multi-layer film in which titanium (Ti), aluminum (Al), Ti, and gold (Au) is sequentially stacked on the n-type clad layer 24. The p-side electrode 34 is formed on the p-type clad layer 30. The p-side electrode 34 is constituted by a multi-layer film in which nickel (Ni) and gold (Au) is sequentially stacked on the p-type clad layer 30.

Figure 2:
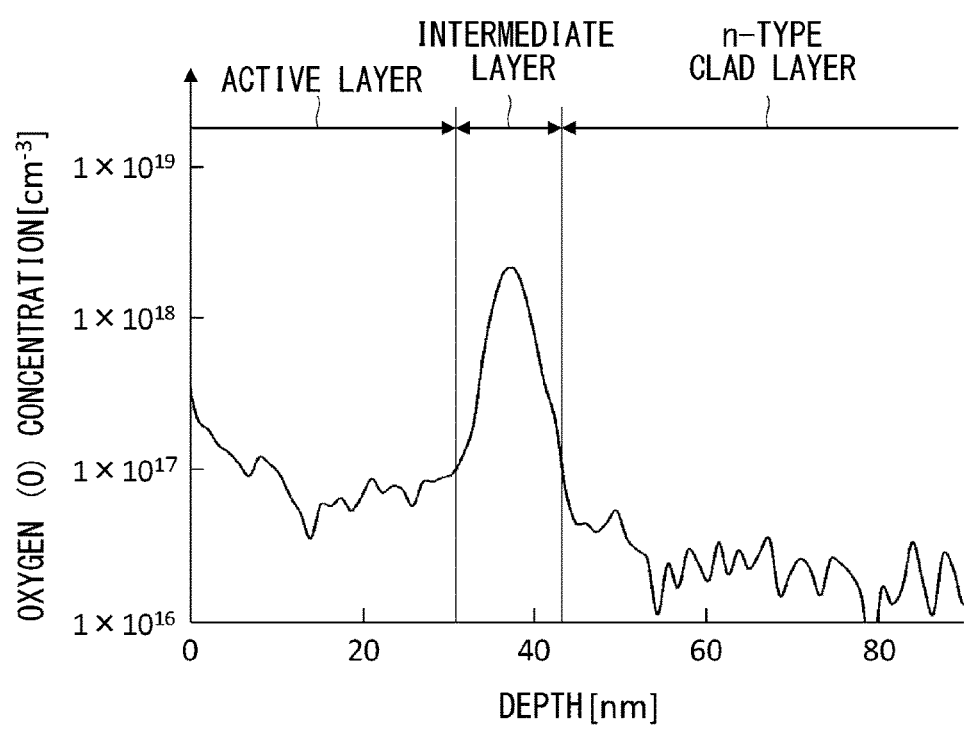
FIG. 2 is a graph that schematically shows an oxygen concentration distribution in the semiconductor light emitting element.

FIG. 2 is a graph that schematically shows an oxygen concentration distribution in the semiconductor light emitting element 10. As shown in FIG. 2, the intermediate layer 25 has a higher oxygen concentration than the n-type clad layer 24 and the active layer 26 adjacent thereto and has a peak concentration in a range from $2\times10^{17}/cm^3$ to $1\times10^{19}/cm^3$ inclusive. Since the oxygen concentration in the n-type clad layer 24 is less than $1\times10^{17}/cm^3$, the intermediate layer 25 has a higher oxygen concentration than the n-type clad layer 24. Also, the active layer 26 has an oxygen concentration of around $1\times10^{17}/cm^3$, which is higher than the oxygen concentration in the n-type clad layer 24 and lower than the oxygen concentration in the intermediate layer 25. In a modification, the n-type clad layer 24 may have a higher oxygen concentration than the active layer 26.

Figure 3:
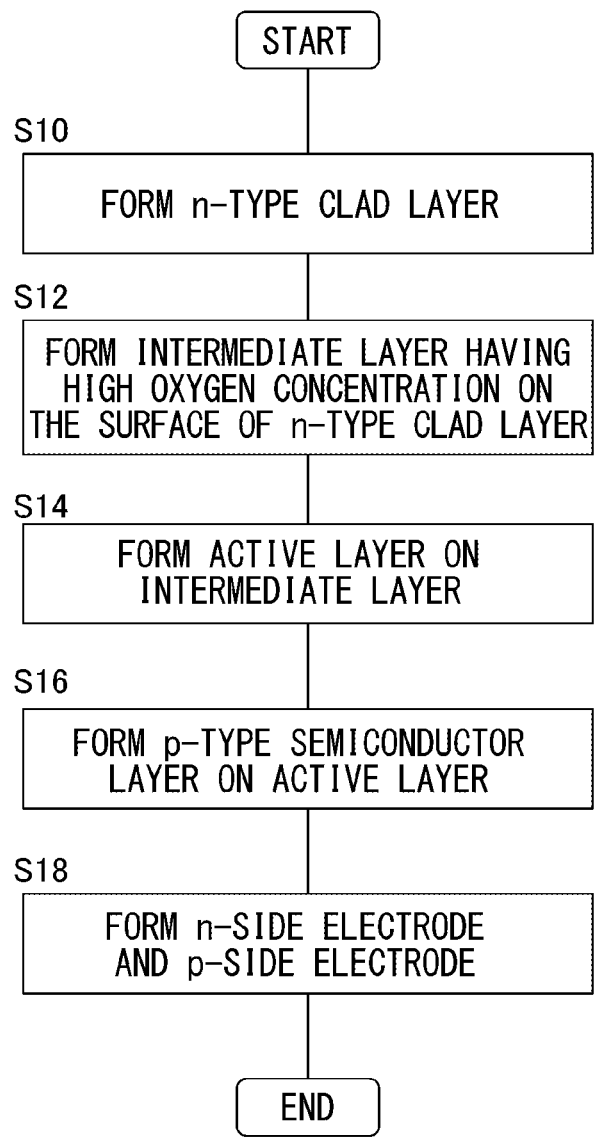
FIG. 3 is a flowchart that shows a method for manufacturing the semiconductor light emitting element.

There will now be described a method for manufacturing the semiconductor light emitting element 10. FIG. 3 is a flowchart that shows a method for manufacturing the semiconductor light emitting element 10. First, the substrate 20 is prepared, and, on the first main surface 20a of the substrate 20, the buffer layer 22 and the n-type clad layer 24 are sequentially formed (S10).

The substrate 20 is a sapphire ($Al_2O_3$) substrate and is a growth substrate on which an AlGaN-based semiconductor material is provided. For example, on the (0001) surface of the sapphire substrate, the buffer layer 22 is formed. The buffer layer 22 may include an AlN layer grown at a high temperature (an HT-AlN layer) and an undoped AlGaN (u-AlGaN) layer, for example. The n-type clad layer 24 is a layer formed of an n-type AlGaN-based semiconductor material and can be formed using a well-known epitaxial growth method, such as metal-organic vapor phase epitaxy (MOVPE) and molecular beam epitaxy (MBE).

Thereafter, on the n-type clad layer 24, the intermediate layer 25 having a high oxygen concentration is formed (S12). The intermediate layer 25 can be formed by oxidizing the surface of the n-type clad layer 24. For example, by exposing the surface of the n-type clad layer 24 to atmospheric gas containing oxygen gas ($O_2$), such as air, the surface of the n-type clad layer 24 can be oxidized.

In order to make the thickness of the intermediate layer 25 less than or equal to 10 nm, it is desirable to perform oxidation of the n-type clad layer 24 at a temperature lower than that at which an AlGaN-based semiconductor material layer, including the n-type clad layer 24, is formed. It is suitable to perform oxidation of the n-type clad layer 24 at a temperature less than 900 degrees C., which may be 100 degrees C. or lower or may be room temperature of about 0 to 30 degrees C., for example. In order to form the intermediate layer 25 with the oxidation performed at a low temperature of 100 degrees C. or lower, the oxidation may be performed in an atmosphere containing oxygen, such as air, for one hour or more, such as 2 hours, 4 hours, 8 hours, 12 hours, or 24 hours.

The intermediate layer 25 may be formed as a layer separate from the n-type clad layer 24, and may be formed by growing a layer containing at least oxygen (O) and aluminum (Al) on the n-type clad layer 24. The intermediate layer 25 may be formed using material gas for providing oxygen (O), aluminum (Al), gallium (Ga), and nitrogen (N), for example. In this case, the intermediate layer 25 can be formed using a well-known epitaxial growth method, such as MOVPE and MBE.

Next, on the intermediate layer 25, the active layer 26 is formed (S14). For example, by alternately stacking barrier layers and well layers on the intermediate layer 25, the active layer 26 having a quantum well structure is formed. The active layer 26 is formed of an AlGaN-based semiconductor material and can be formed using a well-known epitaxial growth method, such as MOVPE and MBE.

Next, on the active layer 26, a p-type semiconductor layer is formed (S16). For example, on the active layer 26, the electron blocking layer 28 may be formed, and the p-type clad layer 30 may be further formed thereon. Each of the electron blocking layer 28 and the p-type clad layer 30 is a layer formed of an AlN-based semiconductor material or an AlGaN-based semiconductor material and can be formed using a well-known epitaxial growth method, such as MOVPE and MBE.

Thereafter, the n-side electrode 32 and the p-side electrode 34 are formed (S18). First, a mask is formed on the p-type clad layer 30, and the active layer 26, electron blocking layer 28, and p-type clad layer 30 in the exposed region on which the mask is not formed are removed. The removal of the active layer 26, electron blocking layer 28, and p-type clad layer 30 can be performed by plasma etching. Thereafter, the n-side electrode 32 is formed on the exposed surface of the n-type clad layer 24, and the p-side electrode 34 is formed on the p-type clad layer 30 after the mask on the p-type clad layer 30 is removed. The n-side electrode 32 and the p-side electrode 34 can be formed using a well-known method, such as electron beam evaporation and sputtering. Thus, the semiconductor light emitting element 10 as shown in FIG. 1 can be completed.

In the present embodiment, since the intermediate layer 25 having a high oxygen concentration is provided between the n-type clad layer 24 and the active layer 26, the crystal quality of the active layer 26 can be improved, so that the light emission output of the semiconductor light emitting element 10 can also be improved. For example, when a light emitting element of which the output wavelength is 270 nm is used, the light emission output obtained in the embodiment in which the intermediate layer 25 is provided is about 1.5 times to 2.5 times as much as the light emission output obtained in a comparative example in which the intermediate layer 25 is not provided. In an embodiment according to the present embodiment, when a current of 100 mA is supplied, the output wavelength is in the range of 260 nm to 270 nm, and the light emission output in the range of 3.4 mW to 3.7 mW can be obtained. Also, by performing the oxidation at a temperature less than 900 degrees C. and setting the thickness of the intermediate layer 25 to 10 nm or less, there can be obtained a light emission output that is about 1.2 times to 2.8 times as much as the light emission output obtained when the oxidation is performed at a temperature of 900 degrees C. or higher and a relatively thick high oxygen concentration region is provided.

In the present embodiment, non-uniformity or fluctuations in the crystal structure of the n-type clad layer 24 are blocked by the intermediate layer 25, so that the occurrence of non-uniformity or fluctuations in the crystal structure of the active layer 26 can be prevented. Accordingly, the AlN composition or thickness of the active layer 26 can be made uniform, thereby stabilizing the light-emitting property of the semiconductor light emitting element 10. Especially, when the active layer 26 is configured to have a multiple quantum well structure, variations in the AlN composition or thickness of each of multiple well layers can be reduced, thereby improving the light-emitting property of the semiconductor light emitting element 10 as a whole.

The present invention has been described with reference to an embodiment. It should be understood by those skilled in the art that the invention is not limited to the above-described embodiment and that various modifications could be developed on the basis of various design modifications and such modifications also fall within the scope of the present invention.

It should be understood that the invention is not limited to the above-described embodiment, but may be modified into various forms on the basis of the spirit of the invention. Additionally, the modifications are included in the scope of the invention.

What is claimed is:

1. A semiconductor light emitting element, comprising:
    an n-type clad layer formed of an n-type aluminum gallium nitride (AlGaN);
    an intermediate layer provided on the n-type clad layer and formed of aluminum gallium oxynitride (AlGaON) or aluminum oxynitride (AlON) having a higher oxygen (O) concentration than the n-type clad layer;
    an active layer provided on the intermediate layer and formed of an AlGaN-based semiconductor material; and
    a p-type semiconductor layer provided on the active layer.

2. The semiconductor light emitting element of claim 1, wherein the intermediate layer is provided in a first region on the n-type clad layer and the semiconductor light emitting element further comprising a n-side electrode provided in a second region on the n-type clad layer, the second region being different from the first region.

3. The semiconductor light emitting element of claim 1, wherein the oxygen concentration in the intermediate layer is $2\times10^{17}/cm^3$ or greater.

4. The semiconductor light emitting element of claim 3, wherein the oxygen concentration in the intermediate layer is $1\times10^{19}/cm^3$ or less.

5. The semiconductor light emitting element of claim 1, wherein the thickness of the intermediate layer is 10 nm or less.

6. The semiconductor light emitting element of claim 1, wherein the active layer has a multiple quantum well structure in which barrier layers formed of an AlGaN-based semiconductor material and well layers formed of an AlGaN-based semiconductor material are alternately stacked.

7. The semiconductor light emitting element of claim 1, further comprising a base layer formed of aluminum nitride (AlN) based semiconductor material, wherein the n-type clad layer is provided on the base layer.

8. The semiconductor light emitting element of claim 1, wherein the intermediate layer is an oxide layer formed by oxidizing a surface of the n-type clad layer.

9. The semiconductor light emitting element of claim 1, wherein the intermediate layer does not include indium (In).

10. The semiconductor light emitting element of claim 1, wherein the thickness of the intermediate layer is 5 nm or less.

* * * * *